(12) United States Patent
Chen et al.

(10) Patent No.: US 6,320,758 B1
(45) Date of Patent: Nov. 20, 2001

(54) INTEGRATED CIRCUIT MOUNTING BOARD WITH BYPASS CAPACITORS

(75) Inventors: Shu-Hui Chen, Taipei Hsien; Nai-Shung Chang, Yung-Ho, both of (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/235,648

(22) Filed: Jan. 22, 1999

(30) Foreign Application Priority Data

Sep. 30, 1998 (TW) .............................. 87116230 A

(51) Int. Cl.[7] .................................... H05K 7/02
(52) U.S. Cl. .................. 361/782; 361/763; 361/764; 361/766; 361/830
(58) Field of Search .................... 361/692, 714, 361/716, 718–720, 729, 737–738, 748, 760, 763–764, 766, 791, 830, 734, 782, 783; 257/724, 924, 723

(56) References Cited

U.S. PATENT DOCUMENTS

| | | | | |
|---|---|---|---|---|
| 4,878,155 | * | 10/1989 | Conley | 361/401 |
| 5,168,432 | * | 12/1992 | Murphy et al. | 361/421 |
| 5,361,491 | * | 11/1994 | Oomachi et al. | 29/852 |
| 5,479,319 | * | 12/1995 | Werther | 361/784 |
| 5,854,534 | * | 12/1998 | Beilin et al. | 257/691 |
| 6,075,700 | * | 6/2000 | Houghton et al. | 361/704 |

* cited by examiner

*Primary Examiner*—Jeffrey Gaffin
*Assistant Examiner*—Thanh Y. Tran
(74) *Attorney, Agent, or Firm*—Jiawei Huang; J. C. Patents

(57) ABSTRACT

An integrated circuit (IC) mounting board is provided for use to mount an IC module and as least one bypass capacitor thereon. The IC mounting board allows the layout of the wiring between the IC module and the circuit lines on the IC mounting board to be more convenient to carry out. Moreover, the IC mounting board allows the bypass capacitor to provide the bypass effect more effectively.

8 Claims, 2 Drawing Sheets

INTEGRATED CIRCUIT MOUNTING BOARD WITH BYPASS CAPACITORS

CROSS-REFERENCE TO RELATED APPLICATION

This application claims the priority benefit of Taiwan application serial no. 87116230, filed Sep. 30, 1998, the full disclosure of which is incorporated herein by reference.

BACKGROUND OF THE INVENTION

1. Field of the Invention

This invention relates to integrated circuit (IC) technology and more particularly. to an IC mounting board for use to mount an IC module and at least one bypass capacitor thereon.

2. Description of Related Art

An IC mounting board is a circuit board designed in particular to mount an IC module thereon. Customarily each power pin of the IC module is connected to a bypass capacitor for the purpose of filtering out any AC components in the power being supplied to the internal circuit of the IC module. The IC mounting board is typically designed with a complex layout of circuit lines used for connection with the pins of the IC module. Since an IC module typically includes a great number of pins, the layout of the circuit lines on the IC mounting board is highly complex to carry out.

A conventional IC mounting board is depicted in the following with reference to FIGS. 1 and 2; wherein FIG. 1A is a schematic top view of the conventional IC mounting board (designated by the reference numeral 100), and FIG. 1B is a schematic side view of the same.

As shown, the conventional IC mounting board 100 including an array of IC soldering points 110 for mounting an IC module 115 thereon through soldering means. Moreover, the IC mounting board 100 includes a plurality of paired SMD (Surface Mounted Device) soldering points 120 arranged around the area defined by the IC soldering points 110, each pair being used to mount a bypass capacitor 125 thereon through soldering means. In this preferred embodiment, for example, the IC module 115 is packaged through the Ball Grid Array (BGA) technology, while the bypass capacitor 125 is an SMD component. There exist, however, some drawbacks to this IC mounting board.

First, the chip (not shown) contained in the BGA-packaged IC module 115 is typically mounted on a small multi-layer printed circuit board (PCB) and electrically connected to the IC soldering points 110 via the printed wires and tin balls on the multi-layer PCB. In order to make the IC module more compact, the number of layers in the multi-layer PCB should be minimal, typically two. The power pins of the IC module 115 are typically arranged in the middle of the bottom side for the purpose of reducing the overall length of the power transmission lines between the IC module 115 and the power supply (not shown). Conventionally, however, the soldering points 120 are arranged outside the area defined by the IC soldering points 110 as illustrated in FIG. 1A, and moreover, these soldering points 120 are separated from the IC module 115 by a distance so that they would not impede the mounting and dismounting of the IC module 115 For these reasons, the bypass capacitor 125 are mounted considerably far away from the power pins of the IC module 115, and therefore, the elongated power transmission path between the bypass capacitor 125 and the power pins (not shown) of the IC module 115 would cause the bypass capacitor 125 to provide the bypass effect less effectively. Therefore, an increased number of bypass capacitors should be provided to enhanced the bypass effect. For instance, in the case of using four different power supplies in the IC module 115, it requires the use of a doubled number of bypass capacitors, i.e, eight, to provide satisfactory bypass effect to the power supply lines.

Moreover, in the case of the IC module 115 having a large number of pins, the conventional arrangement of the bypass capacitors 125 around the IC module 115 would cause the layout design for the IC mounting board to be very difficult to carry out. Typically, a chipset IC module for computer motherboard may have several hundreds of pins that require the same number of circuit lines on the IC mounting board for interconnection. Therefore, the arrangement of the bypass capacitor 125 around the IC module 115 would greatly complicate the layout design work for the IC mounting board. The circuit lines on the IC mounting board may need to be detoured to avoid the bypass capacitors 125. The lengthened signal transmission path may then affect the quality of the data signals being transmitted thereover. Solutions to this problem include the use of multi-layer PCB3 with more layers or a large PCB to implement the IC mounting board. These solutions, however, would undesirably increase the manufacturing cost.

Still moreover, the arrangement of the bypass capacitors 125 around the IC module 115 would impede the mounting and dismounting of the IC module 115. For instance, in the case of the IC module 115 being a BGA package, the mounting and dismounting of the IC module 115 requires the prior dismounting of the bypass capacitors 125, thus making the disassemble work very difficult and laborious to carry out.

SUMMARY OF THE INVENTION

It is therefore an objective of the present invention to provide an IC mounting board, which allows the layout of the wiring between the IC module and the circuit lines on the IC mounting board to be more convenient to implement.

It is another objective of the present invention to provide an IC mounting board, which allows the bypass capacitors to be mounted in such a manner as to allow the bypass capacitors to provide the bypass effect more effectively so as to reduced the total number of the bypass capacitors.

In accordance with the foregoing and other objectives of the present invention, a new IC mounting board is provided. The IC mounting board is designed for use to mount an IC module and at least one bypass capacitor thereon. The IC module has a plurality of pins including at least one power pin. The IC mounting board comprises: a plurality of IC soldering points for use to mount the IC module on the IC mounting board; and at least one mounting hole, provided at a predefined location within the area defined by the IC soldering points, for use to mount the bypass capacitor on the IC mounting board, with the bypass capacitor being connected to the power pin of the IC module.

The bypass capacitor is mounted in the capacitor mounting hole in an upright manner with respect to the IC mounting board, having a first end connected to a front-side soldering point connected to the power pin of the IC module, and a second end connected to a back-side soldering point connected to the ground.

Moreover, the capacitor mounting hole is provided with at least one metal foil, preferably a pair of metal foils therein. These metal foils can help prevent the bypass capacitor, when soldered in position, from being dismounted off position when soldering the IC module in position on the IC mounting board. In addition, these metal foils can help prevent the capacitor mounting hole, when the IC mounting board is being dipped in a tin oven., from being sealed off by the solder in the tin oven.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
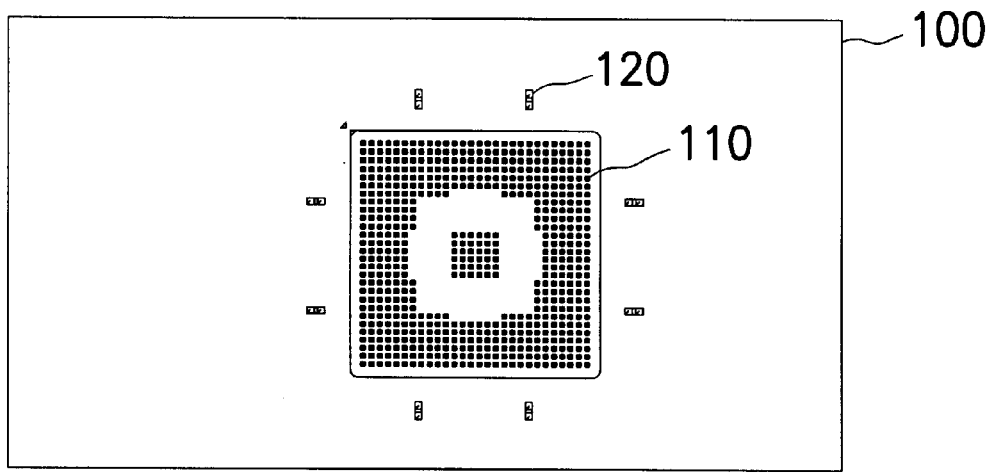
FIG. 1A is a schematic top view of a conventional IC mounting board.
Figure 1B:
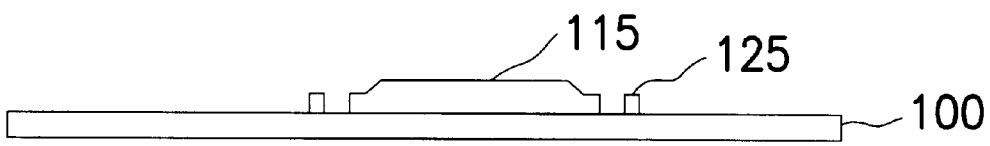
FIG. 1B is a schematic side view of the IC mounting board of FIG. 1A.
Figure 2A:
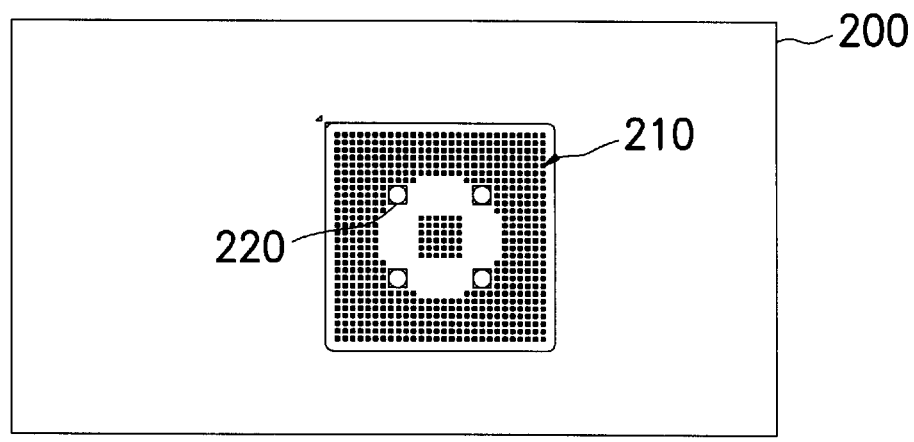
FIG. 2A is a schematic top view of a preferred embodiment of the IC mounting board of the invention.
Figure 2B:
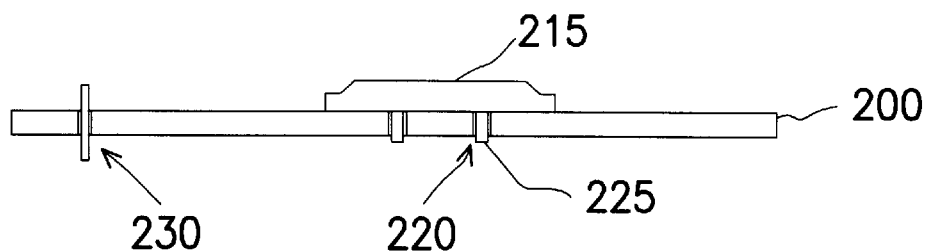
FIG. 2B is a schematic side view of the IC mounting board of FIG. 2A.
Figure 2C:
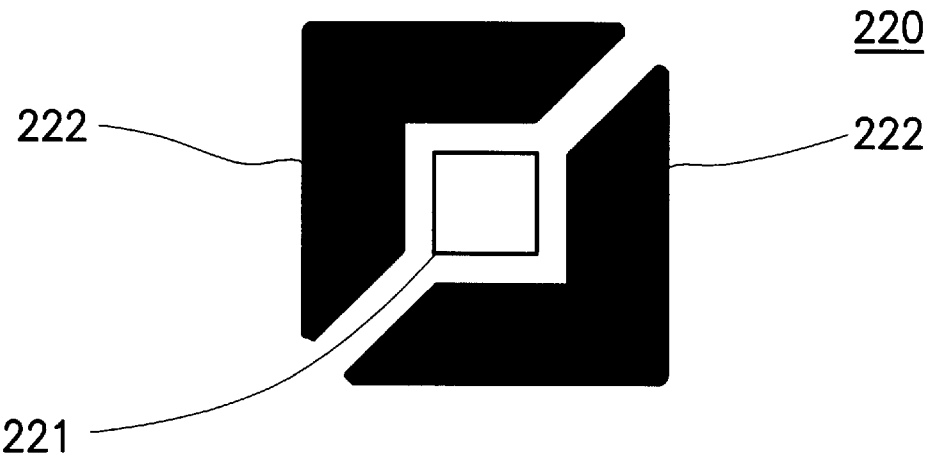
FIG. 2C is a schematic diagram showing an enlarged view of each bypass capacitor mounting hole in the IC mounting board of the invention.

A preferred embodiment of the IC mounting board according to the invention is disclosed in the following with reference to FIGS. 2A, 2B, and 2C; wherein FIG. 2A is a schematic top view of the IC mounting board of the invention; FIG. 2B is a schematic side view of the IC mounting board ol the invention; and FIG. 2C is a schematic diagram showing an enlarged view of each bypass capacitor mounting hole in the IC mounting board of the invention.

In these drawings, only the parts that are related to the invention are illustrated. Those parts that are not within the spirit and scope of the invention are not shown for the purpose of simplifying the description.

As shown in FIG. 2A, the IC mounting board of the invention, here designated by the reference numeral 200, including an array of IC soldering points 210 for mounting an IC module 215 (see FIG. 2B) through soldering means to the IC mounting board 200. Further, it is a characteristic part of the invention that a plurality of mounting holes 220 arc provided at predefined locations within the area defined by the IC soldering points 210 for the mounting of a plurality of bypass capacitors 225 (see FIG. 2B) to the IC mounting board 200. By the invention, the number of the mounting holes 220 can be exactly equal to the number of the power sources used by the internal circuit of the IC module 215. For instance, in the case of the IC module 215 using four power sources including 5 V 33 V. 2.5 V. and 1.5 V. four mounting holes are provided in the IC mounting board 200, as in the example of FIG. 2A, each being used to mount one bypass capacitor in association with one of the four power sources.

The IC module 215 contains an IC chip (not shown) which is packaged in the IC module 215 through BGA technology. Inside the IC module 215, the IC chip is mounted on a small multi-layer printed circuit board (PCB), preferably a two-layer PCB for reduced manufacturing cost, and which is electrically connected to the IC soldering points 210 via the printed wires (not shown) and tin balls (not shown) on this multi-layer PCB (not shown). Due to the reasons that the power supply lines to the IC module 215 are typically large in diameter and that shorter power supply lines can help reduced power consumption, the power pins (not shown) of the IC module 215 are customarily arranged in the middle of the bottom side of the IC module 215. Therefore, the mounting holes 220 can be arranged in the manner shown in FIG. 2A so that the bypass capacitors 225 can be located proximate to the power pins (not shown) of the IC module 215. Although the IC module 215 is a BGA package in this preferred embodiment, it can be various other types of packages.

FIG. 2B shows the mounting of the IC module 215 and the bypass capacitors 225 on the IC mounting board 200. The bypass capacitors 225 can be each, for example, an SMD component, which is typically 2 mm in length and 1.26 mm in height. Since a typical size for the IC mounting, board 200 is from 1.6 mm 2.0 mm in thickness, the bypass capacitors 225 can be mounted in the mounting holes 220 in an upright manner with respect to the IC mounting board 200. Each bypass capacitor 225 has a first end connected by soldering means to a front-side soldering point (not shown) connected to one of the power pins (not shown) of the IC module 215, and a second end connected to a back-side soldering point (not shown) connected to the ground. The IC mounting board 200 shown in FIG. 2B further includes a Dual In-line Package (DIP) pin 230. Typically, the exposed part of the DIP pin 230 is 0.8 mm in length, while the exposed part of the bypass capacitors 225 is only 0.2 mm. Therefore, the upright mounting of the bypass capacitors 725 in the mounting holes 220 would not make the exposed part overly protruded out above the surfaces of the IC mounting board 200.

In the assembly, the first step is to mount all the other SMD components (not shown) except the bypass capacitors 225 onto the IC mounting board 200; and then the IC mounting board 200 is dipped into a tin oven (not shown) to solder these components to the IC mounting board 200. After this, the bypass capacitors 225 are inserted into the mounting holes 220 to mount them onto the IC mounting board 200. Subsequently, the IC module 215 is mounted onto the IC mounting board 200.

With the foregoing, procedures if the mounting holes 220 for the bypass capacitors 225 should be designed to cope with some problems during the assembly. For instance, when the IC mounting board 200 is dipped into the tin oven (not shown), the surface tension of the melted tin would cause the mounting holes 220 to be sealed off thus making the subsequently mounted bypass capacitors 225 unable to be inserted into the mounting holes 220. Moreover, after the bypass capacitors 225 are readily inserted in the mounting holes 220 and soldered in position, since the subsequent mounting of the IC module 215 requires heating to the tin balls (not shown) on the IC soldering points 210, the solder used to solder the bypass capacitors 225 can be melted, thus causing the bypass capacitors 225 to be undesirably dismounted. The solution to this problem is depicted in FIG. 2C.

FIG. 2C is a schematic diagram showing an enlarged view of each of the capacitor mounting holes 220 in the IC mounting board 200 of FIG. 2A. The mounting holes 220 are each structured in a particular manner that can help prevent the solder from sealing off the mounting holes 220 before the bypass capacitors 225 are mounted and also can help prevent the soldered bypass capacitor 225 from being dismounted. As shown, each mounting hole 220 includes a pair of oppositely arranged metal foils 222, mounted in the void portion 221 of the mounting hole 220. A gap is formed between the two metal foils 222 to allow the insertion of the bypass capacitor 225 therein. The provision of these two metal foils 222 allows the void portion 221 of the mounting hole 220 not to be sealed off by the solder when the IC mounting board 200 is being dipped in the tin oven (not shown). The number of the metal foils is not limited to two, and can be three or more. Moreover, the metal foils 222 are sized as large as possible to increase the heat-dissipating efficiency. With the provision of the metal foils 222, the bypass capacitors 225 can be prevented from being dismounted due to the melting of the solder used to mount the bypass capacitors 225 in position by the heat used to solder the IC module 215 in position on the soldering points 210.

In conclusion the IC mounting board of the invention allows the bypass capacitors to be mounted beneath the IC module. This feature allows the invention to have the following advantages over the prior art.

Firsts since the IC module typically has its power pins arranged in the middle of the bottom side thereof the mounting of the bypass capacitors beneath the IC module allows these bypass capacitors to be located proximate to the associated power pins, thereby allowing these bypass capacitors to more effectively provide the desired bypass effect. This can allow the number of the required bypass capacitors to be exactly equal to the number of power pins of the IC module.

Second, the arrangement of the bypass capacitors beneath the IC module allows the layout of the wiring between the IC module and the circuit lines on the IC mounting board to be more convenient to carry out. Moreover, the interconnecting wires can be reduce in length to help shorten the signal transmission distances. The IC operation can thus be more reliable. In addition the easy layout can help reduce the manufacturing cost of the IC production without having to use multi-layer or large PCBs.

Third, the arrangement of the bypass capacitors beneath the IC module would not impede the mounting or dismounting of the IC module. In the case of a BGA-packaged IC module, the IC module can be dismounted without having to dismount the bypass capacitors beforehand. The assembly or disassembly of the IC mounting board are therefore easy and convenient to carry out.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An IC mounting board for mounting an IC module and at least one SMD bypass capacitor thereon, the IC module having a plurality of pins including at least one power pin; the IC mounting board comprising:

a plurality of IC soldering points for mounting the IC module on the IC mounting board; and at least one mounting hole, provided at a predefined location within an area defined by the IC soldering points, wherein the mounting hole comprises a void portion and a first conductive foil formed on a surface of the IC mounting board surrounding the void portion, for mounting the bypass capacitor on the IC mounting board and connecting to the power pin of the IC module, wherein the first conductive foil comprises at least one discontinuous portion separated by a gap, so as to prevent the mounting hole from being sealed off due to surface tension of a solder material when the IC mounting board is dipped in a solder oven.

2. The IC mounting board of claim 1, wherein the IC module is a BGA package.

3. The IC mounting board of claim 1, wherein the bypass capacitor is mounted in the mounting hole in an upright manner with respect to the IC mounting board, having a first end connected to a front-side soldering point connected to the power pin of the IC module, and a second end connected to a back-side soldering point connected to the ground.

4. The IC mounting board of claim 1, wherein the first conductive foil comprises metal.

5. The IC mounting board of claim 1, wherein the first conductive foil comprises a pair of metal foils which are symmetrical to the void portion but separated by the gap.

6. The IC mounting board of claim 1, wherein the conductive foil comprises tin.

7. The IC mounting board of claim 1, wherein the bypass capacitor is an SMD component.

8. The IC mounting board of claim 1, wherein the predefined location is located proximate to an actual location of the power pin on the IC mounting board.

* * * * *